United States Patent Office 3,650,960

Patented Mar. 21, 1972

3,650,960

ETCHING SOLUTIONS

Cyrus M. Strauss, Philadelphia, Pa., and John M. Bauer, San Jose, Calif., assignors to Allied Chemical Corporation, New York, N.Y.

No Drawing. Filed May 6, 1969, Ser. No. 822,288

Int. Cl. C09k *3/00;* C23f *1/02*

U.S. Cl. 252—79.3 4 Claims

ABSTRACT OF THE DISCLOSURE

Etching solutions adapted for etching thin layers of silicon dioxide as required in the manufacture of integrated circuits and other semi-conductor devices, comprising aqueous mixtures of hydrogen fluoride and ammonium fluoride, said mixtures being free from crystallization at temperatures down to at least about +5° F.

This invention relates to etching solutions adapted for etching thin layers of silicon dioxide as required in the manufacture of integrated circuits, transistors and other semiconductor devices.

The electronics industry has recently developed extremely minute electronic circuits of great reliability by placing entire circuits on tiny silicon chips. These are called integrated circuits since all the elements of the circuit are inseparably associated. In one method of making such circuits, a long single crystal of silicon is prepared and is sliced into wafers a few thousandths of an inch thick and about 1 inch in diameter. Each wafer will ultimately yield 100 to 500 individual circuits. The individual wafers contain impurity atoms (dopants) which make them "p-type," i.e., good conductors of positive currents. Over this surface is deposited a thin layer of "n-type" or negative current conducting silicon. Oxidation of the surface is then carried out which forms a layer of silicon dioxide ($SiO_2$) which seals the "doped" silicon below. The silicon dioxide is then removed from certain areas, and in doing this, the areas to be preserved are accurately masked, and the unmasked areas are contacted with etching solutions, usually containing hydrogen fluoride (HF) as the active etchant which attacks and dissolves the silicon dioxide. In preparing an integrated circuit, several successive oxidations and etchings are employed, interspersed with treatments of the exposed surfaces with dopants to achieve the desired conducting circuits. In such operations the etching process is extremely critical and must be carried out in such a way as to rapidly and reproducibly achieve the same degree of etching in the same length of time.

As used in the past, etching solutions have often consisted of hydrogen fluoride (HF) dissolved in water. Because of the extreme activity of hydrogen fluoride, appreciable quantities of ammonium fluoride ($NH_4F$) were often added to the aqueous solutions to reduce the rapidity of attack of such solutions on the $SiO_2$ surfaces and to provide controllable rates of etching, such that accurately reproducible depths of etch could be obtained. Etching solutions were developed, having satisfactory etch rates at temperatures ranging from 18° C. to 25° C., containing between about 3% and about 9% by weight of HF and between about 38% and about 33% ammonium fluoride, the remainder water. These solutions have acceptable etch rates which can be expressed in terms of micrograms per minute of $SiO_2$ dissolved from a 22 mm. square $SiO_2$ surface by the etching solution maintained at 18° C. (64.4° F.). Satisfactory etch rates so measured may range between about 60 micrograms per minute and about 240 micrograms per minute. At higher temperatures (25° C.) etch rates so measured may range between about 70 micrograms per minute and 350 micrograms per minute.

The prior art etching solutions described above, while satisfactory from the point of view of accuracy and speed of etching, were found to have the disadvantage of depositing crystals during handling and storage when exposed to temperatures normally encountered in such stages of operation. This inconvenient crystallization tended to occur at temperatures between about 27° F. and about 69° F., the more concentrated solutions, i.e. those of higher HF concentrations and hence faster etching solutions, crystallizing at the higher temperatures. This crystal deposit, which consisted of ammonium bifluoride ($NH_4HF_2$), changed the concentration of the remaining supernatant etching solution and rendered etches conducted with it inaccurate and unreliable.

It is an object of our invention to provide a series of $SiO_2$ etching solutions having the desirable etching rates of the prior art etching solutions, but which are free from crystallization tendencies at temperatures encountered in handling or storage of such solutions.

It is a further object of our invention to provide a series of such etching solutions which have the same rate of etching at the same etching temperatures as the prior art solutions while employing lower concentrations of hydrogen fluoride in the solution.

These and other objects are accomplished according to our invention wherein etching solutions are provided comprising an aqueous solution of hydrogen fluoride and ammonium fluoride containing between about 1% and about 5% by weight of hydrogen fluoride (HF), and between about 24.5% and about 13.5% of ammonium fluoride ($NH_4F$) by weight, the remainder water.

The new etching solutions of our invention all resist crystallization at temperatures down to about +5° F. (−15° C.), most of them being resistant to crystallization at temperatures as low as about −4° F. (−20° C.). Moreover, our new solutions, despite their relatively lower HF concentrations, have etch rates within the range required for electronic $SiO_2$ etching, namely at 18° C. between about 60 micrograms per minute and about 240 micrograms per minute per 22 square millimeters of intrinsic $SiO_2$ surface, and at 25° C. between about 70 micrograms per minute and about 350 micrograms per minute.

The HF-$NH_4F$ solutions of our invention can be prepared by any convenient method of dissolving the indicated proportions of the components in water. We prefer, however, to blend aqueous solutions of the individual components HF and $NH_4F$, respectively. We find that the standard HF solution containing 49% hydrogen fluoride by weight is well adapted for this purpose. Using this 49% HF solution, it is necessary to employ an ammonium fluoride solution of concentration between about 15% and about 25% $NH_4F$ by weight, preferably about 20%, to provide, by blending, solutions containing the desired relative proportions of the two components. Blends of 1 part by weight of a 49% aqueous hydrogen fluoride solution and between 8.8 parts and about 48 parts by weight of 15% to 25% aqueous $NH_4F$ can be used. Such blends produce mixtures containing from about 1% to about 5% HF and from about 24.5% to about 13.5% $NH_4F$ by weight, the remainder water. Particularly satisfactory are blends of one part by weight of the 49% HF solution with between about 8.8 parts and about 48 parts by weight of a 20% aqueous ammonium fluoride solution. Such blends provide mixtures containing between about 1% and about 5% by weight of HF and between about 19.6% and about 18.0% of $NH_4F$ by weight, the remainder water.

It is particularly surprising that the new blends of our invention not only produce solutions which start to crystallize at such markedly reduced temperatures as compared to the prior art etching solutions, but also that the resulting solutions have high etch rates, in the same commercially required range, as the prior art solutions despite the fact that both the HF concentration and the $NH_4F$ concentration of the mixtures of our invention are strikingly lower at comparable etch rates. This is particularly surprising since prior investigations have indicated that the etch rate tends to increase with increase in HF concentration (Semi-Conductor Products and Solid State Technology, January 1966, page 77, Figure 4 and page 78, col. 2, lines 4–7). The reason for this behavior is not understood, and the complexity of the system involved makes these results unpredictable and surprising.

The following specific examples further illustrate the invention.

EXAMPLES 1–7

Etching solutions were prepared by blending the required proportions of a 49% aqueous HF solution (sp. gr. 1.153) and a 20% aqueous $NH_4F$ (sp. gr. 1.05) to provide a series of seven etching solutions having percentages of HF by weight ranging between 1.0% and 4.5%, and percentages of $NH_4F$ by weight ranging between 19.6% and 18.2%, the remainder water.

Each of the above solutions was tested for etch rate and crystallization temperature by procedures 1 and 2, described below:

(1) Crystallization temperature is determined by placing about 25 ml. of the etch solution in a test tube, immersing a thermometer in the solution, and immersing the test tube in a cooling bath such as ice-water or acetone-Dry Ice, depending on the final temperatures to be reached. The etch solution is thus cooled until crystallization occurs, and the temperature at which the first crystals appear is recorded as the crystallization temperature.

(2) The etch rate test measures the loss in weight of an intrinsic silicon dioxide surface at a specific temperature. The term "intrinsic" means pure (undoped), silicon dioxide. The intrinsic silicon dioxide surfaces used in the tests recorded herein are $SiO_2$ glass cover slides (Corning Micro cover glasses No. 1 squares), .13 mm. to .16 mm. thick and 22 mm. square. In carrying out the etching tests, for cover glasses are wiped clean and are weighed together accurately. The four cover glasses are placed vertically in a hard rubber rack. The rack is lowered into about 1000 ml. of the etching solution which has been bought to the testing temperature (usually 18° C.) before the rack is placed in it. The rack with its cover glasses is maintained in the solution for 10 minutes at the specified temperature. The rack is then removed from the etching solution, then quenched in distilled deionized water for about 2 or 3 minutes. The cover glasses are removed from the rack, dried and accurately weighted together. The etch rate, i.e. micrograms of silicon dioxide dissolved from the glasses per minute is calculated as follows:

$$\text{Etch Rate} = \frac{\text{weight loss (grams)} \times 10^6}{\text{number of glasses} \times \text{time in minutes}}$$

The compositions of the seven examples and results of the crystallization temperature tests and etch rate tests are shown in Table I below. For comparative purposes there are included in the table seven prior art etching solutions (Examples 1A to 7A) of comparable etch rates with their compositions and crystallizing temperatures.

It will be noted from Table I that the new etching solutions of our invention, when compared with prior art etching solutions of the same etch rate, have markedly lower crystallizing temperatures and lower concentrations of HF.

TABLE I

| Example No. | Wt. Percent HF | Wt. Percent $NH_4F$ | Wt. Percent $H_2O$ | Moles HF | Moles $NH_4F$ | Nominal moles $NH_4HF_2$ | Nominal moles excess $NH_4F$ | Crystallization temp. (° F.) | Etch rate at 18° C. (64.4° F.) | Weight ratio 20% $NH_4F$/49% HF |
|---|---|---|---|---|---|---|---|---|---|---|
| 1 | 1.0 | 19.6 | 79.4 | .05 | 0.530 | .05 | .480 | −4 | 66 | 48/1 |
| 2 | 1.3 | 19.5 | 79.2 | 0.65 | .527 | .065 | .462 | −3 | 81 | 36.7/1 |
| 3 | 2.1 | 19.1 | 78.8 | .105 | .516 | .105 | .411 | −2 | 115 | 22.3/1 |
| 4 | 2.6 | 18.9 | 78.5 | .130 | .510 | .130 | .380 | −1 | 138 | 17.8/1 |
| 5 | 3.0 | 18.8 | 78.2 | .150 | .508 | .150 | .358 | −1 | 158 | 15.3/1 |
| 6 | 3.7 | 18.5 | 77.8 | .185 | .500 | .185 | .315 | +1 | 190 | 12.2/1 |
| 7 | 4.5 | 18.2 | 77.3 | .225 | .490 | .225 | .265 | +2 | 224 | 9.9/1 |
| | | | | | | | | | | Weight ratio 40% $NH_4F$/49% HF |
| 1A | 3.3 | 37.8 | 58.9 | 0.16 | 1.02 | 0.16 | 0.86 | +27 | 66 | 13.8/1 |
| 2A | 4.0 | 37.4 | 58.6 | 0.20 | 1.1 | 0.20 | .90 | +33 | 81 | 11.3/1 |
| 3A | 5.5 | 36.0 | 58.5 | 0.275 | .973 | 0.275 | .698 | +44 | 115 | 7.9/1 |
| 4A | 6.4 | 35.4 | 58.2 | .32 | .959 | .32 | .639 | +50 | 138 | 6.7/1 |
| 5A | 7.0 | 34.7 | 58.3 | .35 | .937 | .35 | .587 | +56 | 158 | 6.0/1 |
| 6A | 8.0 | 34.0 | 58.0 | .40 | .919 | .40 | .519 | +61 | 190 | 5.1/1 |
| 7A | 9.0 | 33.0 | 58.0 | .45 | .900 | .45 | .450 | +69 | 224 | 4.4/1 |

We claim:

1. An etching solution which is stable to precipitation of ammonium bifluoride ($NH_4HF_2$) on storage at temperatures between about −15° C. and about 25° C. which consists essentially of an aqueous mixture of hydrogen fluoride and ammonium fluoride containing between about 1% and about 5% hydrogen fluoride (HF) by weight and between about 24.5% and about 13.5% of ammonium fluoride ($NH_4F$) by weight, the remainder water.

2. An etching solution according to claim 1 containing between about 1% and about 5% HF and between about 19.6% and about 18.0% $NH_4F$, the remainder water.

3. The process for producing an etching solution is claimed in claim 1, which comprises blending a 49% by weight aqueous solution of hydrogen fluoride and a 15% to 25% by weight aqueous solution of ammonium fluoride in proportions by weight of between about 8.8 and about 48 parts by weight of the ammonium fluoride solution per one part by weight of the hydrogen fluoride solution.

4. The process according to claim 3 wherein the aqueous ammonium fluoride contains about 20% $NH_4F$ by weight.

References Cited

UNITED STATES PATENTS 3,310,495 3/1967 Masuda et al. ______ 252—79.3
3,518,135 6/1970 Cerniglia et al. _______ 156—17

WILLIAM A. POWELL, Primary Examiner

U.S. Cl. X.R.

156—17